(12) United States Patent
Hadano et al.

(10) Patent No.: US 10,978,318 B2
(45) Date of Patent: Apr. 13, 2021

(54) LASER PROCESSING APPARATUS

(71) Applicant: DISCO CORPORATION, Tokyo (JP)

(72) Inventors: Yuji Hadano, Tokyo (JP); Masatoshi Nayuki, Tokyo (JP); Keiji Nomaru, Tokyo (JP)

(73) Assignee: DISCO CORPORATION, Tokyo (JP)

(*) Notice: Subject to any disclaimer, the term of this patent is extended or adjusted under 35 U.S.C. 154(b) by 204 days.

(21) Appl. No.: 16/163,845

(22) Filed: Oct. 18, 2018

(65) Prior Publication Data
US 2019/0122907 A1    Apr. 25, 2019

(30) Foreign Application Priority Data
Oct. 19, 2017   (JP) .............................. JP2017-202896

(51) Int. Cl.
*H01L 21/67*   (2006.01)
*B23K 26/082*  (2014.01)
(Continued)

(52) U.S. Cl.
CPC ...... *H01L 21/67092* (2013.01); *B23K 26/032* (2013.01); *B23K 26/04* (2013.01); *B23K 26/0622* (2015.10); *B23K 26/0665* (2013.01); *B23K 26/0821* (2015.10); *B23K 26/0823* (2013.01); *B23K 26/0853* (2013.01); *B23K 26/1224* (2015.10); *B23K 26/146* (2015.10); *B23K 26/147* (2013.01); *B23K 26/364* (2015.10); *B23K 26/38* (2013.01);
(Continued)

(58) Field of Classification Search
CPC ............ B23K 2101/40; B23K 2103/56; B23K 26/032; B23K 26/04; B23K 26/0622; B23K 26/0665; B23K 26/0821; B23K 26/0823; B23K 26/0853; B23K 26/1224; B23K 26/146; B23K 26/147; B23K 26/364; B23K 26/38; B23K 26/402; B23K 26/60; B23K 26/702; B60H 1/00007; F25B 21/00; F25B 2321/0022; H01L 21/67092; Y02B 30/66
USPC .................................................... 219/121.68
See application file for complete search history.

(56) References Cited

U.S. PATENT DOCUMENTS 9,209,591 B2 * 12/2015 Takeda .................... H01L 23/00
2004/0112880 A1 * 6/2004 Sekiya ................. B23K 26/364
                                                                219/121.69
2012/0298649 A1 * 11/2012 Nagata ................... B23K 26/16
                                                                219/243

FOREIGN PATENT DOCUMENTS

JP    10305420 A    11/1998
JP    2002192370 A   7/2002
(Continued)

*Primary Examiner* — Dana Ross
*Assistant Examiner* — Joseph W Iskra
(74) *Attorney, Agent, or Firm* — Greer Burns & Crain Ltd.

(57) ABSTRACT

A laser beam applying unit of a laser processing apparatus includes a laser oscillator adapted to emit a laser beam, a condenser adapted to focus the laser beam emitted from the laser oscillator and to thereby apply the laser beam to the workpiece held by a holding unit, and a liquid layer former disposed at a lower end portion of the condenser and adapted to form a layer of a liquid on an upper surface of the workpiece. The liquid layer former includes a casing having a bottom wall that forms a gap between itself and the upper surface of the workpiece, a liquid supply section adapted to supply the liquid to the casing, and a transparent section that is formed at the bottom wall adjacently to the jet port and that permits transmission of the laser beam therethrough.

3 Claims, 4 Drawing Sheets

(51) Int. Cl.
*B23K 26/08* (2014.01)
*B23K 26/06* (2014.01)
*B23K 26/14* (2014.01)
*B23K 26/70* (2014.01)
*B23K 26/146* (2014.01)
*B23K 26/04* (2014.01)
*B23K 26/12* (2014.01)
*B23K 26/0622* (2014.01)
*B23K 26/03* (2006.01)
*B23K 26/38* (2014.01)
*B23K 26/364* (2014.01)
*B23K 26/60* (2014.01)
*B23K 26/402* (2014.01)
*B23K 103/00* (2006.01)
*B23K 101/40* (2006.01)

(52) U.S. Cl.
CPC ............ *B23K 26/402* (2013.01); *B23K 26/60* (2015.10); *B23K 26/702* (2015.10); *B23K 2101/40* (2018.08); *B23K 2103/56* (2018.08)

(56) References Cited

FOREIGN PATENT DOCUMENTS

| | | |
|---|---|---|
| JP | 2004188475 A | 7/2004 |
| JP | 2014221483 A | 11/2014 |

* cited by examiner

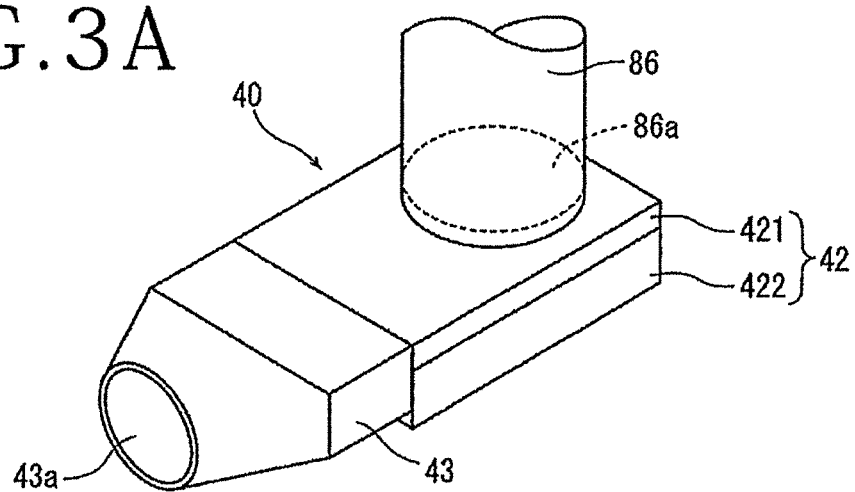
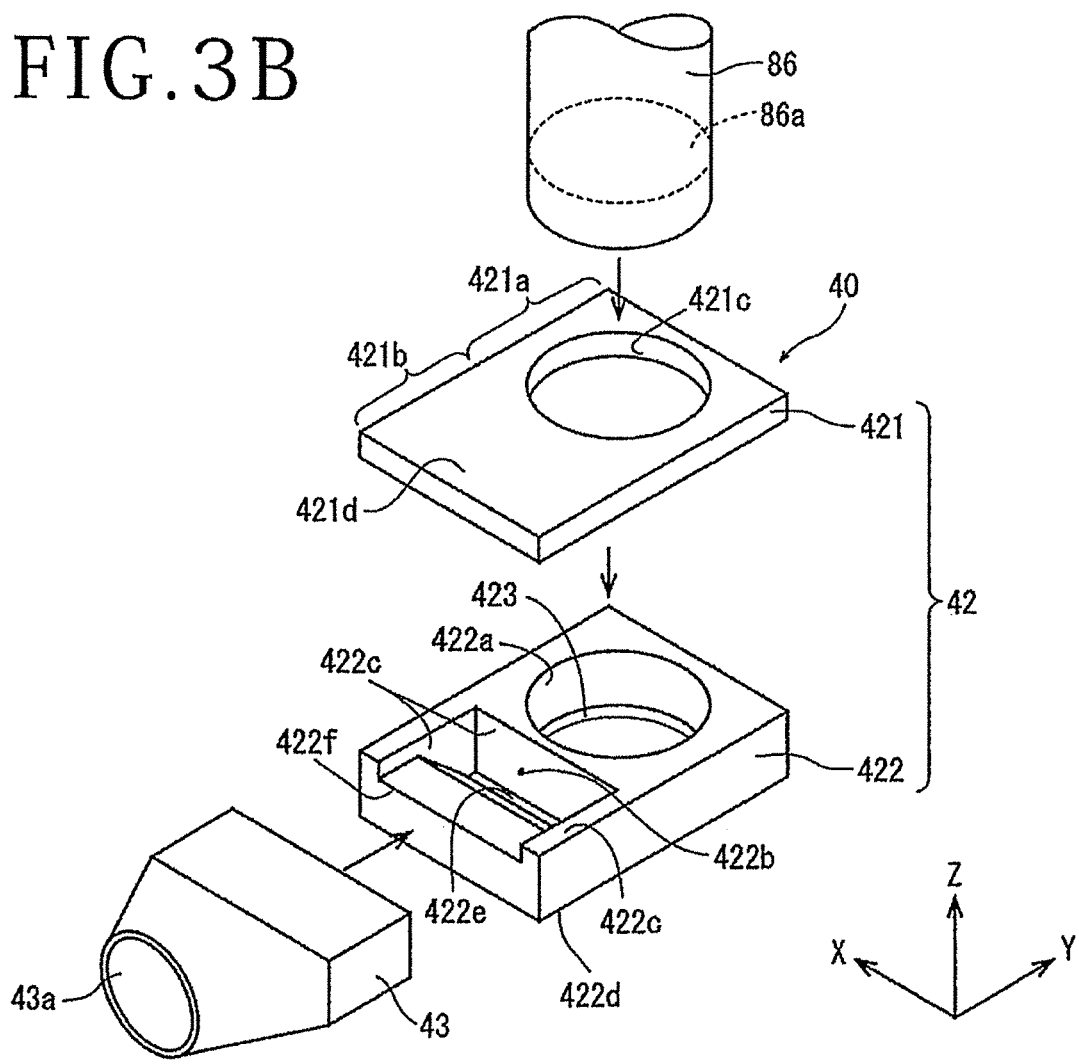

LASER PROCESSING APPARATUS

BACKGROUND OF THE INVENTION

Field of the Invention

The present invention relates to a laser processing apparatus for applying a laser beam to a plate-shaped workpiece to process the workpiece.

Description of the Related Art

A wafer having a plurality of devices such as integrated circuits (ICs) and large-scale integrations (LSIs) formed on a front surface thereof partitioned by division lines (streets) is divided into individual device chips by a laser processing apparatus, and the divided device chips are used for electric apparatuses such as mobile phones, personal computers, and illumination apparatuses.

As examples of the laser processing apparatus, there are those of a type in which a laser beam of such a wavelength as to be absorbed in a workpiece is applied to the workpiece, with a focal point of the laser beam positioned on a front surface of the workpiece, whereby grooves serving as starting points of division are formed by ablation (see, for example, Japanese Patent Laid-open No. Hei 10-305420), those of a type in which a laser beam of such a wavelength as to be transmitted through a workpiece is applied to the workpiece, with a focal point of the laser beam positioned in the inside of the workpiece, whereby modified layers serving as starting points of division are formed in the inside of the workpiece (see, for example, Japanese Patent No. 3408805), and those of a type in which a laser beam of such a wavelength as to be transmitted through a workpiece is applied to the workpiece, with a focal point of the laser beam positioned at the peripheral part of the workpiece, whereby a plurality of shield tunnels each including a minute hole extending from a front surface to a back surface of the workpiece and serving as a starting point of division and an amorphous region surrounding the minute hole are formed (see, for example, Japanese Patent Laid-open No. 2014-221483). One of these types of the laser processing apparatuses is appropriately selected according to the kind of the workpiece, processing accuracy and the like factors.

Of the above-mentioned laser processing apparatuses, that of the type of performing ablation particularly has a problem that debris (laser processing swarf) generated upon application of the laser beam to the front surface of the wafer may scatter and adhere to the front surfaces of the devices formed on the wafer, thereby lowering the quality of the devices. To overcome this problem, there has been proposed a technology in which a liquid resin permitting transmission therethrough of the laser beam used for processing is applied to the front surface of the wafer before performing the laser processing, to thereby prevent adhesion of debris, and the liquid resin is removed after performing the laser processing (see, for example, Japanese Patent Laid-open No. 2004-188475).

SUMMARY OF THE INVENTION

According to the technology described in Japanese Patent Laid-open No. 2004-188475, the coating with the liquid resin makes it possible to prevent debris from adhering to the front surfaces of the devices, whereby processing quality is secured. However, this technology needs the step of applying the liquid resin and the step of removing the liquid resin after the processing, and has a problem as to productivity. Further, since the liquid resin cannot be utilized repeatedly, the technology is uneconomical.

There has also been proposed a technology in which application of a laser beam is conducted with a wafer immersed in water, to cause debris to float in the water, whereby adhesion of the debris to the front surface of the wafer is prevented. In the case where the laser beam is applied to the wafer with the wafer immersed in water, however, minute bubbles are generated from that part of the wafer to which the laser beam is applied, leading to a problem that the propagation of the laser beam is obstructed by the bubbles, and desired processing cannot be achieved.

It is therefore an object of the present invention to provide a laser processing apparatus by which a laser beam can be applied to a plate-shaped workpiece to process the workpiece, while preventing the application of the laser beam to the workpiece from being obstructed.

In accordance with an aspect of the present invention, there is provided a laser processing apparatus including: a holding unit adapted to hold a plate-shaped workpiece; a laser beam applying unit adapted to apply a laser beam to the workpiece held by the holding unit to process the workpiece; and a processing feeding unit adapted to put the holding unit and the laser beam applying unit into relative processing feeding, in which the laser beam applying unit includes a laser oscillator adapted to emit a laser beam, a condenser adapted to focus the laser beam emitted from the laser oscillator and to thereby apply the laser beam to the workpiece held by the holding unit, and a liquid layer former disposed at a lower end portion of the condenser and adapted to form a layer of a liquid on an upper surface of the workpiece, the liquid layer former includes a casing having a bottom wall that forms a gap between itself and the upper surface of the workpiece, a liquid supply section adapted to supply the liquid to the casing, to fill the gap with the liquid through a jet port formed in the bottom wall, to thereby form the layer of the liquid and to cause the liquid to flow down, and a transparent section that is formed at the bottom wall adjacently to the jet port and that permits transmission of the laser beam therethrough, and the laser beam is applied to the workpiece through the transparent section and the layer of the liquid filling the gap.

Preferably, the jet port includes a slit extending in a processing feeding direction. Preferably, the laser beam applying unit further includes dispersing means dispersing the laser beam oscillated from the laser oscillator.

According to the present invention, the liquid layer former includes: the casing having the bottom wall that forms the gap between itself and the upper surface of the workpiece; the liquid supply section adapted to supply the liquid to the casing, to fill the gap with the liquid through the jet port formed in the bottom wall, to thereby form the layer of the liquid and to cause the liquid to flow down; and the transparent section that is formed at the bottom wall adjacently to the jet port and that permits transmission of the laser beam therethrough. In addition, the laser beam is applied to the workpiece through the transparent section and the layer of the liquid filling the gap. As a result, a laser processing apparatus is provided in which application of the laser beam to the workpiece is not obstructed. In addition, in the case where the present invention is applied to a laser processing apparatus for performing ablation, adhesion of debris generated at the time of laser processing to devices can be restrained, and processing quality of the devices is prevented from being lowered, without coating the front surface of the wafer with a liquid resin.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 3A is a perspective view of a liquid layer former mounted to the laser processing apparatus depicted in FIG. 1;

FIG. 3B is an exploded perspective view of the liquid layer former;

DETAILED DESCRIPTION OF THE PREFERRED EMBODIMENT

Figure 1:
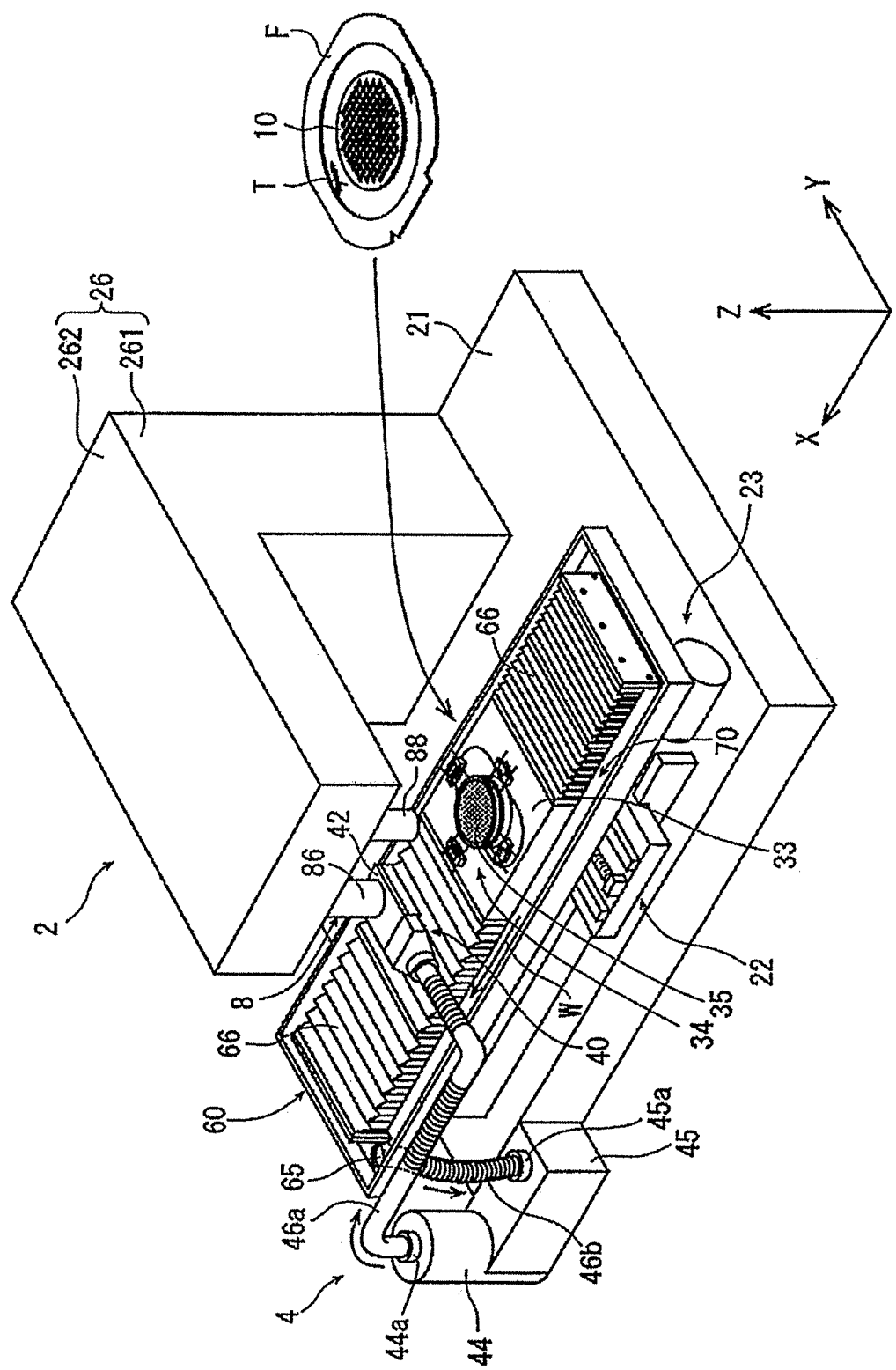
FIG. 1 is a perspective view of a laser processing apparatus according to an embodiment of the present invention.

A laser processing apparatus according to an embodiment of the present invention will be described more in detail below, referring to the attached drawings. FIG. 1 depicts a perspective view of a laser processing apparatus 2 according to the present embodiment. The laser processing apparatus 2 includes: a holding unit 22 disposed on a base 21 and adapted to hold a plate-shaped workpiece (for example, a wafer 10 made of silicon); a moving mechanism 23 adapted to move the holding unit 22; a frame body 26 composed of a vertical wall section 261 erected in a Z-direction indicated by arrow Z at a lateral side of the moving mechanism 23 on the base 21, and a horizontal wall section 262 extending in a horizontal direction from an upper end portion of the vertical wall section 261; a liquid supply mechanism 4; and a laser beam applying unit 8. As illustrated in the figure, the wafer 10 is, for example, supported by an annular frame F through an adhesive tape T, and is held by the holding unit 22. Note that the laser processing apparatus 2 as a whole is covered by a housing or the like, which is omitted in illustration for convenience of explanation, such that dust and the like are prevented from entering the inside of the laser processing apparatus 2.

Figure 2:
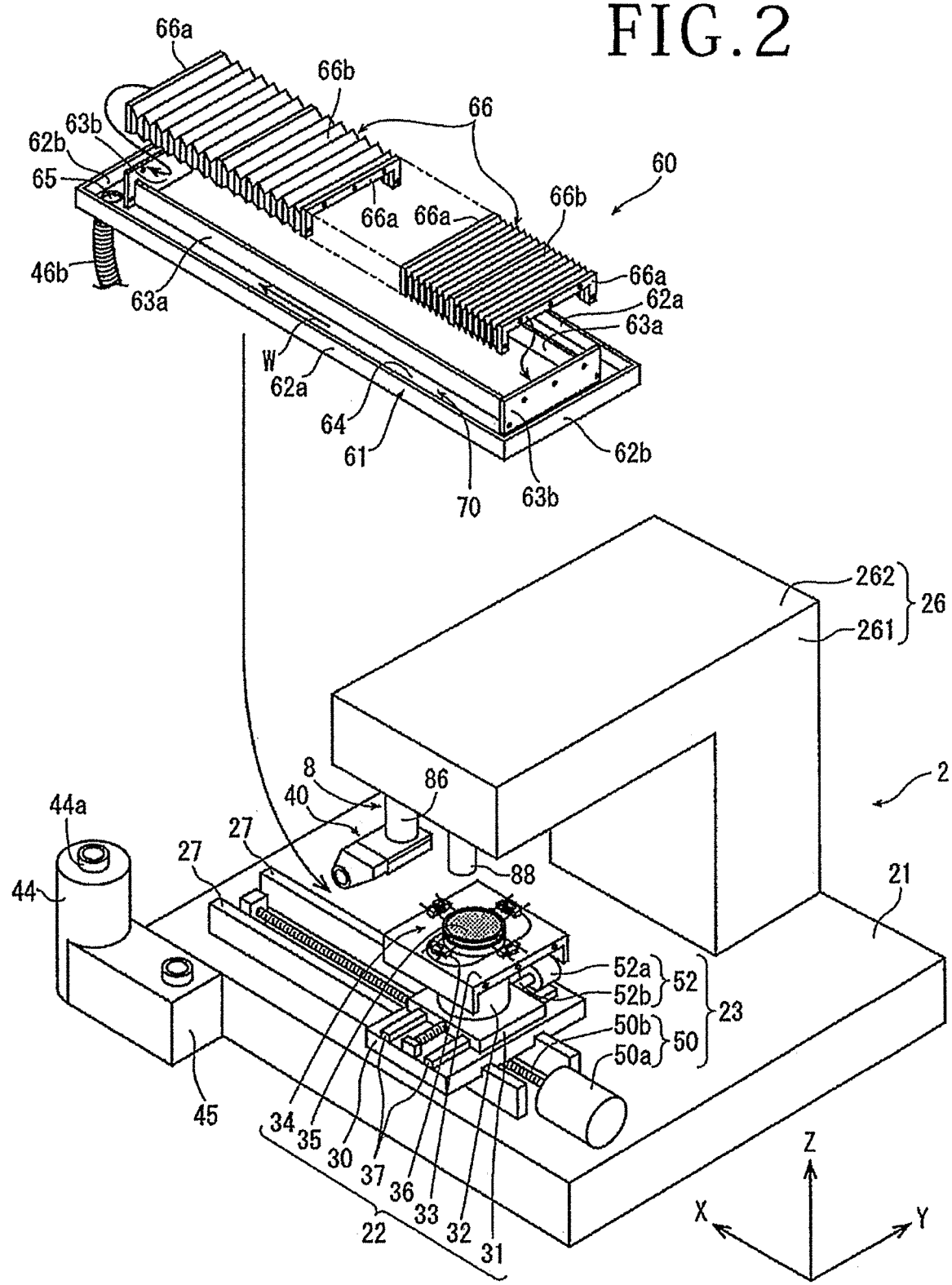
FIG. 2 is an exploded perspective view depicting the laser processing apparatus depicted in FIG. 1, with a part in a dismantled state.

FIG. 2 is a perspective view of the laser processing apparatus 2 depicted in FIG. 1, depicting a state in which a liquid recovery pool 60 constituting a part of the liquid supply mechanism 4 is detached from the laser processing apparatus 2 and is dismantled.

Referring to FIG. 2, the laser processing apparatus 2 according to the present embodiment will be described in detail. In the inside of the horizontal wall section 262 of the frame body 26, there is accommodated an optical system constituting the laser beam applying unit 8 adapted to apply a laser beam to the wafer 10 held by the holding unit 22. On the lower surface side of a tip portion of the horizontal wall section 262, a condenser 86 which constitutes part of the laser beam applying unit 8 is disposed, and an alignment unit 88 is disposed at a position adjacent to the condenser 86 in a direction indicated by arrow X in the figure. The alignment unit 88 is utilized for imaging the workpiece held by the holding unit 22, to detect a region to be laser processed, and performing alignment between the condenser 86 and a processing position of the workpiece.

The alignment unit 88 includes an imaging element (charge-coupled device (CCD)) using visible rays to image the front surface of the wafer 10. Depending on the material constituting the wafer 10, however, the alignment unit 88 preferably includes infrared (IR) ray applying means applying IR rays, an optical system adapted to capture the IR rays applied by the IR ray applying means, and an imaging element (IR CCD) adapted to output an electrical signal corresponding to the IR rays captured by the optical system.

The holding unit 22 includes: a rectangular X-direction movable plate 30 mounted on the base 21 such as to be movable in the X-direction indicated by arrow X in FIG. 2; a rectangular Y-direction movable plate 31 mounted on the X-direction movable plate 30 such as to be movable in a Y-direction indicated by arrow Y in FIG. 2; a cylindrical support column 32 fixed to an upper surface of the Y-direction movable plate 31; and a rectangular cover plate 33 fixed to an upper end of the support column 32. At the cover plate 33, there is disposed a chuck table 34 extending upward through a slot formed over the cover plate 33. The chuck table 34 holds the circular workpiece, and is rotatable by rotational driving means (not depicted). On an upper surface of the chuck table 34 is disposed a circular suction chuck 35 which is formed from a porous material and extends substantially horizontally. The suction chuck 35 is connected to suction means (not depicted) through a flow passage extending through the support column 32, and four clamps 36 are evenly arranged in the periphery of the suction chuck 35. The clamps 36 grasp the frame F holding the wafer 10, at the time of fixing the wafer 10 to the chuck table 34. The X-direction is the direction indicated by arrow X in FIG. 2, and the Y-direction is the direction indicated by arrow Y and orthogonal to the X-direction. A plane defined by the X-direction and the Y-direction is substantially horizontal.

The moving mechanism 23 includes an X-direction moving unit 50 and a Y-direction moving unit 52. The X-direction moving unit 50 converts a rotational motion of a motor 50a into a rectilinear motion, and transmits the rectilinear motion to the X-direction movable plate 30, through a ball screw 50b, thereby causing the X-direction movable plate 30 to advance and retract in the X-direction along guide rails 27 on the base 21. The Y-direction moving unit 52 converts a rotational motion of a motor 52a into a rectilinear motion, and transmits the rectilinear motion to the Y-direction movable plate 31, through a ball screw 52b, thereby causing the Y-direction movable plate 31 to advance and retract in the Y-direction along guide rails 37 on the X-direction movable plate 30. Note that while illustration is omitted, the X-direction moving unit 50 and the Y-direction moving unit 52 are each provided with position detection means, whereby it is possible to accurately detect the X-directional position, the Y-directional position, and the circumferential rotational position of the chuck table 34, and to accurately position the chuck table 34 at an arbitrary position and an arbitrary angle by driving the X-direction moving unit 50, the Y-direction moving unit 52, and rotational driving means (not depicted). The X-direction moving unit 50 is a processing feeding unit adapted to move the holding unit 22 in a processing feeding direction, and the Y-direction moving unit 52 is an indexing feeding unit adapted to move the holding unit 22 in an indexing feeding direction.

Referring to FIGS. 1 to 3B, the liquid supply mechanism 4 will be described. As depicted in FIG. 1, the liquid supply mechanism 4 includes a liquid layer former 40, a liquid supply pump 44, a filter 45, the liquid recovery pool 60, a pipe 46a which connects the liquid layer former 40 and the liquid supply pump 44, and a pipe 46b which connects the liquid recovery pool 60 and the filter 45. Note that each of the pipe 46a and the pipe 46b is preferably formed, partly or entirely, of a flexible hose.

As illustrated in FIG. 3A, the liquid layer former 40 is disposed at a lower end portion of the condenser 86. An exploded view of the liquid layer former 40 is depicted in FIG. 3B. As seen from FIG. 3B, the liquid layer former 40 includes a casing 42 and a liquid supply section 43. The casing 42 is substantially rectangular in plan view, and is composed of a casing upper member 421 and a casing lower member 422.

The casing upper member 421 is divided into two regions 421a and 421b in a Y-direction indicated by arrow Y in the figure, is formed, in the region 421a on the depth side in the figure, with a circular opening 421c in which to insert the condenser 86, and is formed, in the region 421b on the viewer's side, with a plate-shaped section 421d. The casing lower member 422 is formed, in a region facing the opening 421c of the casing upper member 421, with a cylindrical opening 422a which has the same shape as the opening 421c and is disposed at a position in register with the position of the opening 421c in plan view. At a bottom portion of the opening 422a is provided a circular plate-shaped transparent section 423, which closes the bottom portion of the opening 422a. The transparent section 423 has such a property as to permit transmission therethrough of a laser beam LB described later, and is composed of a glass plate, for example. The casing lower member 422 is formed, in a region facing the plate-shaped section 421d of the casing upper member 421, with a liquid flow passage section 422b for jetting a liquid from a bottom wall 422d of the casing 42. The liquid flow passage section 422b is a space defined by the plate-shaped section 421d of the casing upper member 421, side walls 422c, and the bottom wall 422d. The bottom wall 422d of the liquid flow passage section 422b is formed with a slit-shaped jet port 422e extending in a processing feeding direction indicated by arrow X, and a side surface on the side for connection with the liquid supply section 43 is formed with a liquid supply port 422f for supplying a liquid to the liquid flow passage section 422b. A lower surface of the transparent section 423 is formed to be flush with the slit-shaped jet port 422e extending in the processing feeding direction, and the transparent section 423 forms a part of the bottom wall 422d of the casing lower member 422.

The liquid supply section 43 includes a supply port 43a supplied with a liquid W, a discharge port (omitted in illustration) formed at such a position as to face the liquid supply port 422f formed in the casing 42, and a communication passage (omitted in illustration) for providing communication between the supply port 43a and the discharge port. The liquid supply section 43 is assembled onto the casing 42 in the Y-direction, whereby the liquid layer former 40 is formed.

The liquid layer former 40 is configured as above-mentioned. The liquid W discharged from the liquid supply pump 44 is supplied to the liquid supply port 422f of the casing 42 through the supply port 43a of the liquid supply section 43, the communication passage in the inside of the liquid supply section 43, and the discharge port, then flows through the liquid flow passage section 422b of the casing 42, and is jetted from the jet port 422e formed in the bottom wall 422d. As depicted in FIG. 1, the liquid layer former 40 has the liquid supply section 43 and the casing 42 attached to a lower end portion of the condenser 86 in such a manner as to be aligned in the Y-direction. As a result, the jet port 422e formed in the bottom wall 422d of the casing 42 is positioned to extend along an X-direction, which is the processing feeding direction.

Returning to FIGS. 1 and 2, the liquid recovery pool 60 will be described. As illustrated in FIG. 2, the liquid recovery pool 60 includes an outer frame body 61 and two waterproof covers 66.

The outer frame body 61 includes: outer walls 62a extending in the X-direction indicated by arrow X in the figure; outer walls 62b extending in the Y-direction indicated by arrow Y in the figure; inner walls 63a and 63b disposed in parallel to the outer walls 62a and 62b on the inner sides of the outer walls 62a and 62b with a predetermined interval therebetween; and a bottom wall 64 connecting lower ends of the outer walls 62a and 62b and the inner walls 63a and 63b. The outer walls 62a and 62b, the inner walls 63a and 63b and the bottom wall 64 define a rectangular liquid recovery passage 70 of which the longitudinal direction is along the X-direction and the transverse direction is along the Y-direction. An opening penetrating in the vertical direction is formed on the inner side of the inner walls 63a and 63b constituting the liquid recovery passage 70. The bottom wall 64 constituting the liquid recovery passage 70 is provided with slight inclinations in the X-direction and the Y-direction, and a liquid discharge hole 65 is disposed at a corner portion (a corner portion on the left side in the figure) corresponding to a lowermost position of the liquid recovery passage 70. The pipe 46b is connected to the liquid discharge hole 65, and the liquid discharge hole 65 is connected to the filter 45 through the pipe 46b. Note that the outer frame body 61 is preferably formed from a stainless steel plate material which is highly resistant to corrosion and rusting.

Each of the two waterproof covers 66 includes gate-shaped metallic fixtures 66a, and a resin-made cover member 66b which is bellows-like in shape and both ends of which are secured to the metallic fixtures 66a. The metallic fixtures 66a are formed in such a size as to be able to straddle the two inner walls 63a disposed in the manner of facing each other in the Y-direction of the outer frame body 61. One of the metallic fixtures 66a of each of the two waterproof covers 66 is fixed to each of the inner walls 63a disposed in the manner of facing each other in the X-direction of the outer frame body 61. The liquid recovery pool 60 configured in this way is fixed on the base 21 of the laser processing apparatus 2 by fixtures (not depicted). The cover plate 33 of the holding unit 22 is mounted in the manner of being clamped between the metallic fixtures 66a of the two waterproof covers 66. Note that end faces in regard of the X-direction of the cover member 33 are in the same gate shape as that of the metallic fixtures 66a, and are sized such as to straddle the inner walls 63a of the outer frame body 61 in the Y-direction, like the metallic fixtures 66a; therefore, the cover member 33 is attached to the waterproof covers 66 after the outer frame body 61 of the liquid recovery pool 60 is disposed on the base 21. According to the configuration as above-mentioned, when the cover plate 33 is moved in the X-direction by the X-direction moving mechanism 50, the cover plate 33 is moved along the inner walls 63a of the liquid recovery pool 60. Note that the method of attaching the waterproof covers 66 and the cover member 33 is not limited to the above-mentioned procedure; for example, a method may be adopted in which the cover member 33 is preliminarily attached before attaching the two waterproof covers 66 to the inner walls 63b of the outer frame body 61, and the waterproof covers 66 are attached, together with the cover member 33, to the outer frame body 61 which is mounted to the base 21 preceedingly.

Returning to FIG. 1 for continuing the description, with the liquid supply mechanism 4 being configured as above-mentioned, the liquid W discharged from the discharge port 44a of the liquid supply pump 44 is supplied to the liquid layer former 40 through the pipe 46a. The liquid W supplied to the liquid layer former 40 is jetted downward through the jetting port 422e formed in the bottom wall 422d of the casing 42 of the liquid layer former 40. The liquid W jetted from the liquid layer former 40 flows on the cover plate 33 or the waterproof covers 66, and flows down to the liquid recovery pool 60. The liquid W having flowed down to the liquid recovery pool 60 flows through the liquid recovery passage 70, to be collected into the liquid discharge hole 65 provided at the lowermost position of the liquid recovery passage 70. The liquid W collected into the liquid discharge hole 65 is led through the pipe 46b to the filter 45, where laser processing sward (debris) and dust and the like are removed, and the liquid W is returned to the liquid supply pump 44. In this way, the liquid W discharged by the liquid supply pump 44 is circulated in the liquid supply mechanism 4.

Figure 4:
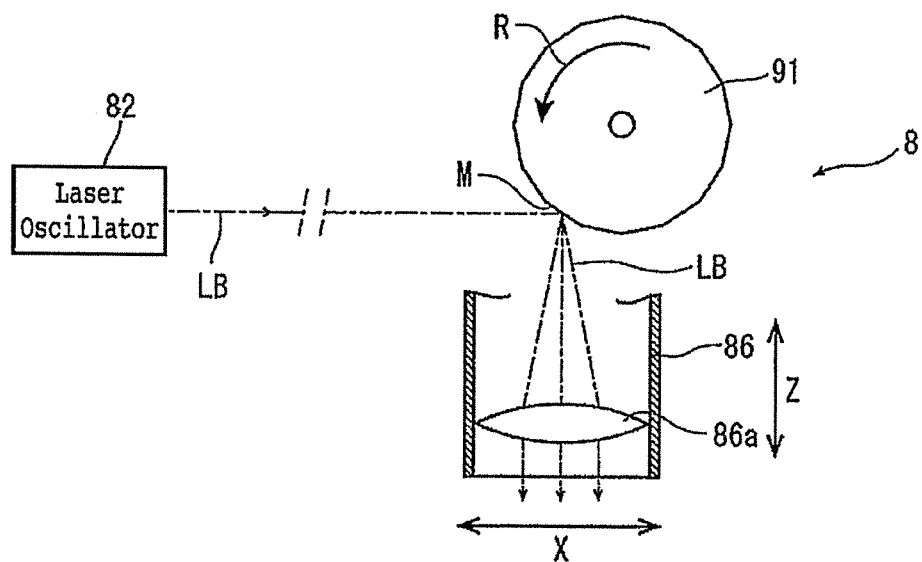
FIG. 4 is a block diagram for explaining an optical system of a laser beam applying unit mounted to the laser processing apparatus depicted in FIG. 1.

FIG. 4 is a block diagram depicting generally the optical system of the laser beam applying unit 8. As depicted in FIG. 4, the laser beam applying unit 8 includes: a laser oscillator 82 adapted to emit a pulsed laser beam LB; an attenuator (omitted in illustration) adapted to control the output of the laser beam LB emitted from the laser oscillator 82; a reflection mirror (omitted in illustration) adapted to appropriately change the optical path of the laser beam LB emitted from the laser oscillator 82; a polygon mirror 91 as dispersing means dispersing the application direction of the laser beam LB; and the condenser 86. The laser oscillator 82 oscillates, for example, a laser beam of such a wavelength as to be absorbed in the workpiece.

The polygon mirror 91 disposed at an upper portion of the condenser 86 is provided with a motor (not depicted) for rotating the polygon mirror 91 at a high speed in a direction indicated by arrow R. Inside the condenser 86, there is disposed a focusing lens (fe lens) 86a adapted to focus the laser beam LB and thereby to apply the laser beam LB to the workpiece. As depicted in the figure, the polygon mirror 91 has a plurality of mirrors M arranged concentrically with respect to a rotational axis of the polygon mirror 91. The fe lens 86a is positioned under the polygon mirror 91, and functions to focus the laser beam LB reflected by the polygon mirror 91 and to apply the laser beam LB to the wafer 10 on the chuck table 34. With the polygon mirror 91 rotated, the angle of the laser beam LB reflected by the mirrors M is varied in a predetermined range, whereby the laser beam LB is applied while being dispersed within a predetermined range in the processing feeding direction (X-direction) on the wafer 10.

Further, the laser beam applying unit 8 includes focal point position control means (not depicted). While illustration of the specific configuration of the focal point position control means is omitted, for example, a configuration may be adopted which includes a ball screw extending in the Z-direction indicated by arrow Z and having a nut section fixed to the condenser 86, and a motor connected to an end portion of the ball screw. According to such a configuration, a rotational motion of the motor is converted into a rectilinear motion, and the condenser 86 is moved along guide rails (omitted in illustration) disposed in the Z-direction, whereby the position, in the Z-direction indicated by arrow Z, of the focal point of the laser beam LB focused by the condenser 86 is controlled.

The laser processing apparatus 2 of the present invention is generally configured as above-mentioned, and an operation thereof will be described below. In performing laser processing by the laser processing apparatus 2 in the present embodiment, the plate-shaped workpiece, for example, the wafer 10 formed from silicon (Si) and formed with devices on a front surface thereof, which is supported by the annular frame F through the adhesive tape T is prepared. After the wafer 10 is prepared, the wafer 10 is placed on the suction chuck 35 of the chuck table 34 depicted in FIG. 1, in a state in which the front surface thereof formed with the devices is on the upper side, and the wafer 10 is fixed by the clamps 36 or the like. After the wafer 10 is fixed on the suction chuck 35, a suction source (not depicted) is operated, to generate a suction force on the suction chuck 35, whereby the wafer 10 is held by suction.

Figure 5:
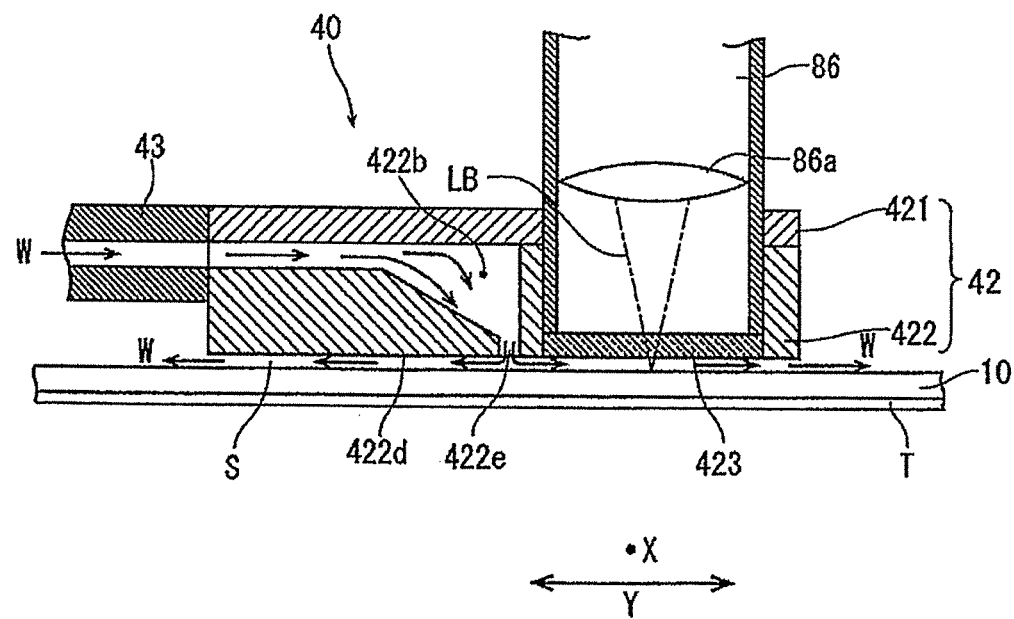
FIG. 5 is a partial enlarged sectional view depicting an operating state at the time of processing of the liquid layer former mounted to the laser processing apparatus depicted in FIG. 1.

After the wafer 10 is held by the suction chuck 35, the chuck table 34 is moved appropriately in the X-direction and the Y-direction by the moving mechanism 23, and the wafer 10 on the chuck table 34 is thereby positioned at a position beneath the alignment unit 88. After the wafer 10 is positioned beneath the alignment unit 88, an upper surface of the wafer 10 is imaged by the alignment unit 88. Next, based on the image of the wafer 10 picked up by the alignment unit 88, alignment between the wafer 10 and the condenser 86 is performed by such a technique as pattern matching. Based on position information obtained by the alignment, the chuck table 34 is moved, whereby the condenser 86 is positioned at a position on the upper side of a processing starting position on the wafer 10. Subsequently, the condenser 86 is moved in the Z-direction by the focal point position control means (not depicted), whereby the focal point is positioned at a surface level of one end portion of the division line which is a starting position for application of the laser beam LB on the wafer 10. FIG. 5 depicts a schematic sectional view, as cut in the Y-direction, of the liquid layer former 40. As seen from FIG. 5, the liquid layer former 40 of the liquid supply mechanism 4 is disposed at the lower end portion of the condenser 86, and such a setting is made that when the focal point is positioned at the height of the front surface of the wafer 10, a gap S of approximately 0.5 to 2.0 mm, for example, is formed between the bottom wall 422d of the casing 42 constituting the liquid layer former 40 and the front surface of the wafer 10.

After the alignment between the condenser 86 and the wafer 10 is performed, a sufficient quantity of the liquid W is supplemented to the liquid supply mechanism 4 through the liquid recovery passage 70 of the liquid recovery pool 60, and the liquid supply pump 44 is operated. As the liquid W circulated in the inside of the liquid supply mechanism 4, there is used, for example, pure water.

With the liquid supply mechanism 4 configured as above-mentioned, the liquid W discharged from the discharge port 44a of the liquid supply pump 44 is supplied to the liquid layer former 40 through the pipe 46a. The liquid W supplied to the liquid layer former 40 is jetted downward through the jet port 422e formed in the bottom wall 422d of the casing 42 of the liquid layer former 40. The liquid W jetted from the jet port 422e forms a layer of the liquid W while filling the gap S formed between the bottom wall 422d of the casing 42 and the wafer 10, particularly, between the transparent section 423 and the wafer 10, thereafter flows down, and is recovered by the liquid recovery pool 60. The liquid W having flowed down in the liquid recovery pool 60 flows through the liquid recovery passage 70, to be collected into the liquid discharge hole 65 provided at the lowermost position of the liquid recovery passage 70. The liquid W collected in the liquid discharge hole 65 is led through the pipe 46b to the filter 45, where the liquid W is clarified, and is returned to the liquid supply pump 44. In this way, the liquid W discharged by the liquid supply pump 44 is circulated in the liquid supply mechanism 4.

With the lapse of a predetermined time (approximately several minutes) after the start of an operation of the liquid supply mechanism 4, a state results in which the gap S between the bottom wall 422d of the casing 42, particularly, the transparent section 423 and the wafer 10 is filled up with the liquid W, with the formation of a layer of the liquid W, and the liquid W is stably circulated in the liquid supply mechanism 4.

In a state in which the liquid W is stably circulated in the liquid supply mechanism 4, the X-direction moving mechanism 50 is operated to move the chuck table 34 at a predetermined moving velocity in the processing feeding direction (X-direction), while operating the laser beam applying unit 8. The laser beam LB applied from the condenser 86 is transmitted through the transparent section 423 of the liquid layer former 40 and the layer of the liquid W, to be applied to the processed position (division line) of the wafer 10. In applying the laser beam LB to the wafer 10, the laser beam LB is applied to the wafer 10 in a dispersed manner, attendant on the rotation of the polygon mirror 91, as has been described based on FIG. 4. After the laser beam LB is applied to a predetermined mirror M, the laser beam LB is applied to the next mirror M located on the downstream side with respect to the rotating direction R of the polygon mirror 91, whereby the laser beam LB is continuedly and dispersedly applied to the wafer 10. During when the laser beam LB is oscillated from the laser oscillator 82 and the polygon mirror 91 is rotated, such laser processing is repeated. Note that the number of sheets of the mirrors M constituting the polygon mirror 91, the rotational speed of the polygon mirror 91 and the like factors are appropriately determined according to the workpiece.

Note that the laser processing by the laser processing apparatus 2 as above may be carried out, for example, under the following processing conditions.

Wavelength of laser beam: 226 nm, 355 nm, 532 nm, 1,064 nm
Average output: 10 to 100 W
Repetition frequency: 0 to 300 MHz
Pulse width: 50 fs to 1 ns
Processing feeding speed: 10 to 1,000 mm/s When ablation is performed in the above-mentioned state, air bubbles are generated in the liquid W located at that position on the wafer 10 to which the laser beam LB is applied. In connection with this, in the present embodiment, as described based on FIG. 5, the liquid W is made to constantly flow at a predetermined flow velocity through the gap formed on the wafer 10. As a result, the air bubbles generated in the vicinity of the application position of the laser beam LB are swiftly removed to the exterior through the gap formed on the wafer 10. Particularly, according to the present embodiment, the jet port 422e formed in the bottom wall 422d of the casing 42 is located at a position adjacent in the Y-direction to the transparent section 423 formed similarly at the bottom wall 422d, and is formed in a slit shape extending in the processing feeding direction. This configuration ensures that the liquid W is supplied from a direction orthogonal to the X-direction, or the direction in which the laser beam LB is dispersed, and the air bubbles generated in the liquid W are removed. As a result, the laser beam LB can be applied to the wafer 10 while avoiding the air bubbles generated due to the ablation, and favorable ablation can be carried out continuedly.

Further, with the liquid W continuedly flowing through the gap on the wafer 10, the debris released into the liquid W is swiftly removed from the area on the wafer 10 together with the air bubbles. As is seen from FIG. 1, the liquid W containing the air bubbles and the debris flows on the cover plate 33 and the waterproof covers 66, to be led into the liquid recovery passage 70 of the liquid recovery pool 60. The liquid W led into the liquid recovery passage 70 flows through the liquid recovery passage 70 while releasing the air bubbles, generated due to ablation, to the exterior, and is discharged through the liquid discharge hole 65 formed at the lowermost position of the liquid recovery passage 70. The liquid W discharged through the liquid discharge hole 65 is led to the filter 45 through the pipe 46b, and is again supplied to the liquid supply pump 44. The liquid W is circulated in the liquid supply mechanism 4 in this way, whereby the debris and dust and the like are appropriately trapped by the filter 45, and the liquid W is maintained in a clean state.

After the ablation is carried out for the predetermined division line extending in a first direction, the moving mechanism 23 is operated to position the condenser 86 at one end portion of an unprocessed division line adjacent to the just-laser-processed division line in the Y-direction, and the same laser processing as the above-mentioned ablation is conducted. After the ablation is performed for all the division lines extending in the first direction, the chuck table 34 is rotated by 90 degrees, and the similar ablation is performed for the unprocessed division lines orthogonal to the previously processed division lines extending in the first direction. In this way, ablation can be carried out for all the division lines on the wafer 10.

According to the present embodiment, the laser beam LB is applied to the wafer 10 through the transparent section 423 disposed in the liquid layer former 40 and the layer of the liquid W, to perform laser processing, and the air bubbles generated from the front surface of the wafer 10 and the debris generated due to the laser processing and the like are swiftly removed together with the liquid W. As a result, the air bubbles generated from the front surface of the wafer 10 are prevented from hampering the laser processing, adhesion of debris to the devices after processing and the like troubles are prevented, and processing quality is prevented from being lowered.

While the transparent section 423 has been composed of a glass plate in the above embodiment, this is not limitative. The transparent section 423 need only be a transparent plate through which the laser beam LB is transmitted, and, for example, it may be a resin-made plate such as an acrylic resin plate.

While the laser beam LB applied from the laser oscillator 82 has been guided to the focusing lens 86 while being dispersed by the polygon mirror 91 in the above embodiment, this configuration is not restrictive. A mirror or mirrors fixed in a reflection direction may be used in place of the polygon mirror 91. Further, while an example in which the laser processing applied to the wafer 10 is ablation has been presented in the above embodiment, the laser processing may be processing of forming modified layers in the inside of a workpiece (for example, the laser processing described in Japanese Patent No. 3408805) or processing of forming so-called shield tunnels (for example, the laser processing described in Japanese Patent Laid-open No. 2014-221483).

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing apparatus comprising:
a holding unit adapted to hold a plate-shaped workpiece;
a laser beam applying unit adapted to apply a laser beam to the workpiece held by the holding unit to process the workpiece; and
a processing feeding unit adapted to put the holding unit and the laser beam applying unit into relative processing feeding,
wherein the laser beam applying unit includes a laser oscillator adapted to emit a laser beam, a condenser adapted to focus the laser beam emitted from the laser oscillator and to thereby apply the laser beam to the workpiece held by the holding unit, and a liquid layer former disposed at a lower end portion of the condenser and adapted to form a layer of a liquid on an upper surface of the workpiece,
the liquid layer former includes a casing having a bottom wall that forms a gap between itself and the upper surface of the workpiece, a liquid supply section adapted to supply the liquid to the casing, to fill the gap with the liquid through a jet port formed in the bottom wall, to thereby form the layer of the liquid and to cause the liquid to flow down, and a transparent section that is formed at the bottom wall of the casing adjacently to the jet port and that permits transmission of the laser beam through a different location on the bottom wall offset from the jet port, and
the laser beam is applied to the workpiece through the transparent section of the bottom wall and the layer of the liquid filling the gap.

2. The laser processing apparatus according to claim 1, wherein the jet port includes a slit extending in a processing feeding direction.

3. The laser processing apparatus according to claim 1, wherein the laser beam applying unit further includes dispersing means dispersing the laser beam in a processing feeding direction.

* * * * *